US008610141B2

(12) United States Patent
Tohyama et al.

(10) Patent No.: US 8,610,141 B2
(45) Date of Patent: Dec. 17, 2013

(54) THREE-DIMENSIONAL LED SUBSTRATE AND LED LIGHTING DEVICE

(75) Inventors: Naoya Tohyama, Yokohama (JP); Takuya Inoue, Yokohama (JP); Kouichi Kumagai, Yokohama (JP); Takaha Kunieda, Yokohama (JP)

(73) Assignee: Liquid Design Systems, Inc., Yokohama-Shi (JP)

( * ) Notice: Subject to any disclaimer, the term of this patent is extended or adjusted under 35 U.S.C. 154(b) by 0 days.

(21) Appl. No.: 13/640,869

(22) PCT Filed: Apr. 14, 2011

(86) PCT No.: PCT/JP2011/059311
§ 371 (c)(1),
(2), (4) Date: Oct. 12, 2012

(87) PCT Pub. No.: WO2011/129415
PCT Pub. Date: Oct. 20, 2011

(65) Prior Publication Data
US 2013/0026509 A1 Jan. 31, 2013

(30) Foreign Application Priority Data
Apr. 15, 2010 (JP) ................................. 2010-094486

(51) Int. Cl.
H01L 33/08 (2010.01)
H01L 33/64 (2010.01)
H01L 33/62 (2010.01)

(52) U.S. Cl.
USPC ..................... 257/88; 257/99; 257/E33.066

(58) Field of Classification Search
USPC ........................................ 257/88, 99, E33.066
See application file for complete search history.

(56) References Cited

FOREIGN PATENT DOCUMENTS

| JP | 5048073 A | 2/1993 |
|----|-----------|--------|
| JP | 6314863 A | 11/1994 |
| JP | 2004004426 A | 1/2004 |
| JP | 2005277380 A | 10/2005 |
| JP | 2006313717 A | 11/2006 |
| JP | U3128613 | 1/2007 |
| JP | 2009177098 A | 8/2009 |
| JP | 2009266424 A | 11/2009 |
| JP | 2010056059 A | 3/2010 |

Primary Examiner — Whitney T Moore
(74) Attorney, Agent, or Firm — R. Neil Sudol; Coleman Sudol Sapone, P.C.

(57) ABSTRACT

The invention includes one or more LED elements, a silicon substrate on which the LED elements are mounted via micro bumps and internally formed wiring is connected to the micro bumps, a heat insulation organic substrate which is stuck to the opposite side of the LED elements-mounting side of the silicon substrate and has through-holes in which the wiring goes through, a chip-mounting substrate which is stuck to the opposite side of the silicon substrate side of the heat insulation organic substrate and internally formed wiring is connected to wiring in the through-holes of the heat insulation organic substrate, and an LED control circuit chip which is connected to the wiring of the chip-mounting substrate via micro bumps, and mounted via the micro bumps on the opposite side of the heat insulation organic substrate side of the chip-mounting substrate.

11 Claims, 22 Drawing Sheets

THREE-DIMENSIONAL LED SUBSTRATE AND LED LIGHTING DEVICE

TECHNICAL FIELD

The present invention relates to a three-dimensional substrate and an LED lighting device.

BACKGROUND ART

Conventionally, in order to prolong the lifetime of LED (light emitting diode) bulbs, it is necessary to efficiently release the heat generated by the LED elements so that the LED elements and the LED control circuit are not damaged by the heat. Therefore, an LED bulb which controls the increase of temperature of the lighting circuit when the LED light is lit and maintains the lifetime of the lighting circuit (refer to patent document 1). As for the LED bulb described in the patent document 1, as shown in the FIG. 1 of the patent document 1, the LED module 11 is added to the heat releasing element 12 and the heat from the LED is released from the plurality of heat releasing fins 18 of the heat releasing element 12. A lighting circuit 17 which lights the LED is embedded in the hallow part 23 of the metal cap 16 which is located on the opposite side of the globe 14 of the heat releasing element 12.

As for the LED bulb described in the patent document 1, it is possible to make the distance between the LED module 11 and the lighting circuit long, and the heat releasing element 12 and the metal cap 16 are insulated by the insulation 15. As such, the heat generated by the LED of the LED module 11 is not conducted to the lighting circuit 17 but mostly released at the heat releasing element 12, thus the temperature increase of the lighting circuit 17 is suppressed.

CITATION LIST

Patent Literature

PTL1: Japanese Patent Application Laid-Open No. 2010-56059

SUMMARY OF THE INVENTION

Technical Problems

The present invention is to resolve the problems of the conventional technologies.

Solution to the Problems

The first embodiment of the present invention includes one or more LED elements, a silicon substrate on which the LED elements are mounted via micro bumps and internally formed wiring is connected to the micro bumps, a heat insulation organic substrate which is stuck to the opposite side of the LED elements mounting side of the silicon substrate and has through-holes in which the wiring goes through, a chip-mounting substrate which is stuck to the opposite side of the silicon substrate side of the heat insulation organic substrate and internally formed wiring is connected to wiring in the through-holes of the heat insulation organic substrate, and an LED control circuit chip which is connected to the wiring of the chip-mounting substrate via micro bumps, and mounted via the micro bumps on the opposite side of the heat insulation organic substrate side of the chip-mounting substrate.

The second embodiment of the present invention includes a three-dimensional LED substrate that has: one or more LED elements; a silicon substrate to which the LED elements are mounted via micro bumps and internally formed wiring is connected to micro bumps; a heat insulation organic substrate which is stuck to the opposite side of the LED elements-mounting side of the silicon substrate and has through-holes in which the wiring goes through; a chip-mounting substrate which is stuck to the opposite side of the silicon substrate side of the heat insulation organic substrate and the internally formed wiring is connected to the wiring inside the through-holes of the heat insulation organic substrate; and an LED control circuit chip which is connected to the wiring of the chip-mounting substrate via micro bumps, and mounted on the opposite side of the heat insulation organic substrate side on the chip-mounting substrate via micro bumps, a heat releasing unit which includes aluminum and is formed so that the edge of the three-dimensional LED substrate is enclosed, a heat conductive unit which includes aluminum and conducts heat from the silicon substrate to the heat releasing unit and is joined respectively to the heat releasing unit and the silicon substrate of the three-dimensional LED substrate, a globe which is formed so that the LED-mounting side of the LED substrate at the opening of the heat releasing unit is covered, and a metal cap which is connected to the heat releasing unit.

The third embodiment of the present invention includes a three-dimensional LED substrate that has: one or more LED elements; a silicon substrate to which the LED elements are mounted via micro bumps and an internally formed wiring is connected to micro bumps; a heat insulation organic substrate which is stuck to the opposite side of the LED elements-mounting side of the silicon substrate and has through-holes in which the wiring goes through, a chip-mounting substrate which is stuck to the opposite side of the silicon substrate side of the heat insulation organic substrate and the internally formed wiring is connected to the wiring inside the through-holes of the heat insulation organic substrate, an LED control circuit chip which is connected to the wiring of the chip-mounting substrate via micro bumps, and mounted on the opposite side of the heat insulation organic substrate side on the chip-mounting substrate via micro bumps, an aluminum substrate which is disposed between the silicon substrate and the heat insulation organic substrate and has through-holes for which the wiring inside the silicon substrate and the wiring inside the heat insulation organic substrate are connected, a heat releasing unit which includes aluminum and is formed so that the edge of the three-dimensional LED substrate is enclosed and the unit is joined to the aluminum substrate a globe which is formed so that the LED-mounting side of the LED substrate at the opening of the heat releasing unit is covered, and a metal cap which is connected to the heat releasing unit.

The fourth embodiment of the present invention includes a longitudinally formed aluminum substrate, a plurality of silicon substrates which are stuck in a pre-determined alignment on one side of the aluminum substrate, one or more LED elements which are connected to the wiring of the silicon substrates via micro bumps and mounted on the silicon substrates via micro bumps, a heat insulation organic substrate which is stuck on the other side of the aluminum substrate and comprising through-holes for the wiring to go through, a chip-mounting substrate which is stuck in the pre-determined alignment on the opposite side of the aluminum substrate side of the heat insulation organic substrate and the internal wiring is connected to the wiring of the silicon substrate via through-holes, an LED control circuit chip which is connected to the wiring of the chip-mounting substrate via micro bumps and mounted on the other side of the heat insulation organic substrate side on the chip-mounting substrate via micro bumps, a heat releasing unit which is formed so that the chip-mounting substrate side of the aluminum substrate is covered, is connected to the aluminum substrate, and releases the heat from the aluminum substrate, a light transmission material which is formed so that the opposite side of the chip-mounting substrate side of the aluminum substrate is covered and externally transmits light from the LED elements, and a pair of terminals which are formed on the both edges of the longitudinal direction of the aluminum substrate and the power is supplied to.

Effect of the Invention

By the present invention, the lifetime of an LED becomes longer and its brightness also increases.

DESCRIPTION OF EMBODIMENTS

Best exemplary embodiments of the present invention are explained as follow, referring to some figures.

Figure 1:
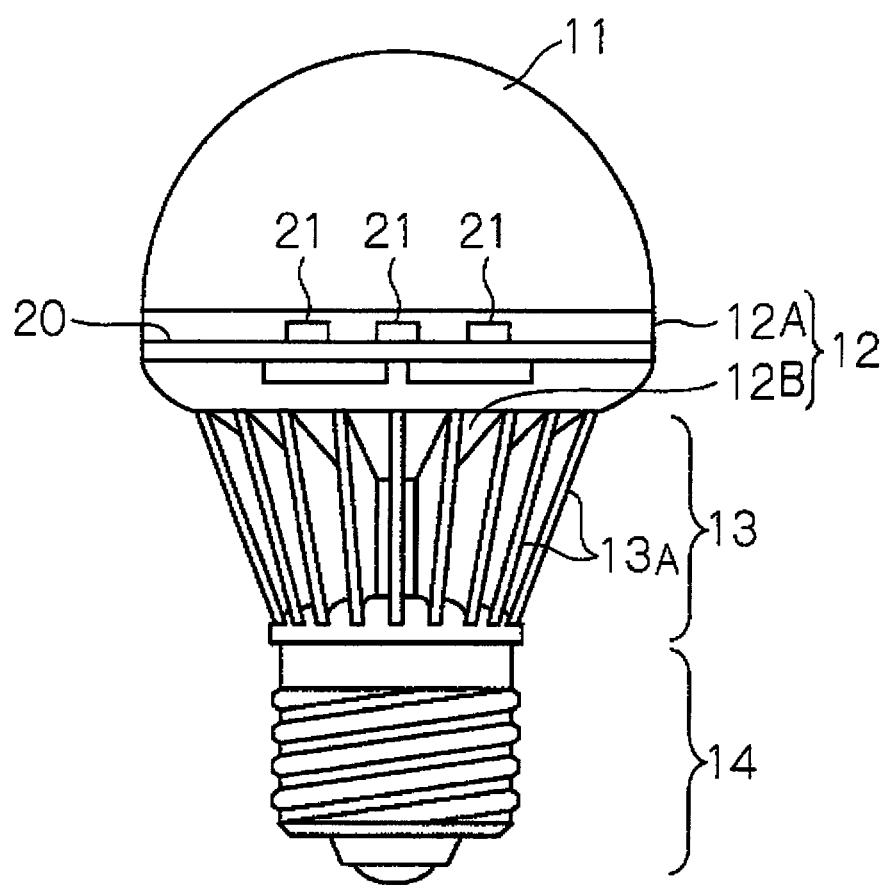
FIG. 1 is a sectional view of the LED lighting device in which the present invention is implemented as the first embodiment.

[First Embodiment] FIG. 1 is a view showing the configuration of the LED lighting device in which the present invention is mounted as the first embodiment. The LED lighting device in which the present invention is mounted as the first embodiment takes a form of a light bulb and it comprises a three-dimensional silicon interposer 20 on which the LED elements 21 are mounted, a globe 11 which externally releases the light generated by the LED elements 21, an aluminum die cast 12 which holds the three-dimensional silicon interposer 20 as well as externally releases the heat, a heat releasing unit 13 which comprises a plurality of heat releasing fins 13a, and a metal cap 14 which is a metal component screwed into a light bulb socket. It is also possible that the LED lighting device comprises a lens instead of a globe.

Figure 2:
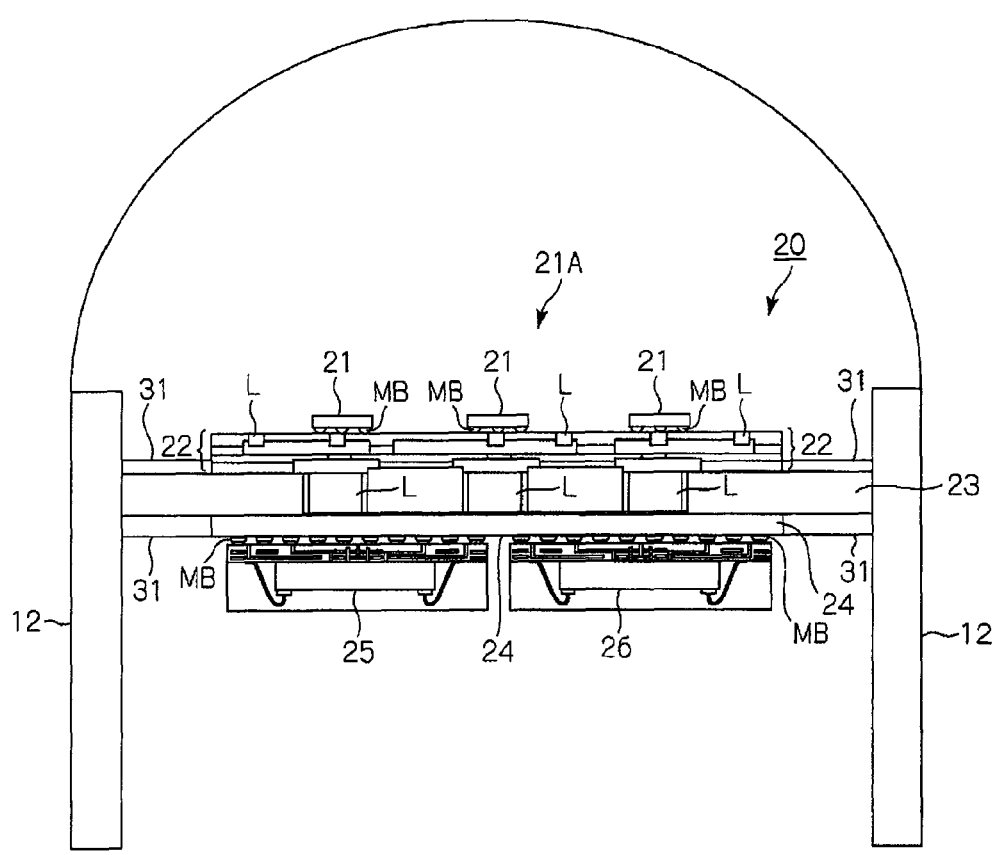
FIG. 2 is a sectional view of the three-dimensional silicon interposer disposed inside the aluminum die cast.

FIG. 2 is a sectional view of the three-dimensional silicon interposer 20 disposed inside the aluminum die cast 12. The aluminum die cast 12 has a high heat conductivity and it is a substrate holding member which holds the three-dimensional silicon interposer 20. The aluminum die cast 12, as shown in FIG. 1, comprises a cylinder-formed member 12A which has a cylinder shape and formed in such a manner that it encloses the edge of the three-dimensional silicon interposer 20, and the bottom floor 12B which is formed in such a manner that it encloses the edge of the opening located on the opposite side of the side on which the LED elements 21 are placed among two of the openings of the cylinder-formed member 12A. At the side on which the LED elements 21 are placed among two of the openings of the cylinder-formed member 12A, the opening of the globe 11 is joined in such a manner that it encloses the LED elements 21.

Inside the cylinder-formed member 12A of the aluminum die cast 12, the three-dimensional silicon interposer 20 on which four LED elements 21 are mounted as surface mount is disposed. The number of LED elements is not limited to four and it can be any number more than one. And the heat generated in the three-dimensional silicon interposer 20 is conducted to the aluminum die cast 12 and released externally as well as conducted to heat releasing unit 13.

The heat releasing unit 13 comprises a plurality of heat releasing fins 13a which are joined to the bottom floor 12B of the aluminum die cast 12. Thus, the heat releasing unit 13 efficiently releases the heat generated by the three-dimensional silicon interposer 20. The metal cap 14 has a groove so that it can be screwed into a socket. Also, the metal cap 14 is electrically connected to a wiring L of the three-dimensional silicon interposer 20 as well as it is joined to the heat releasing unit 13.

Figure 3:
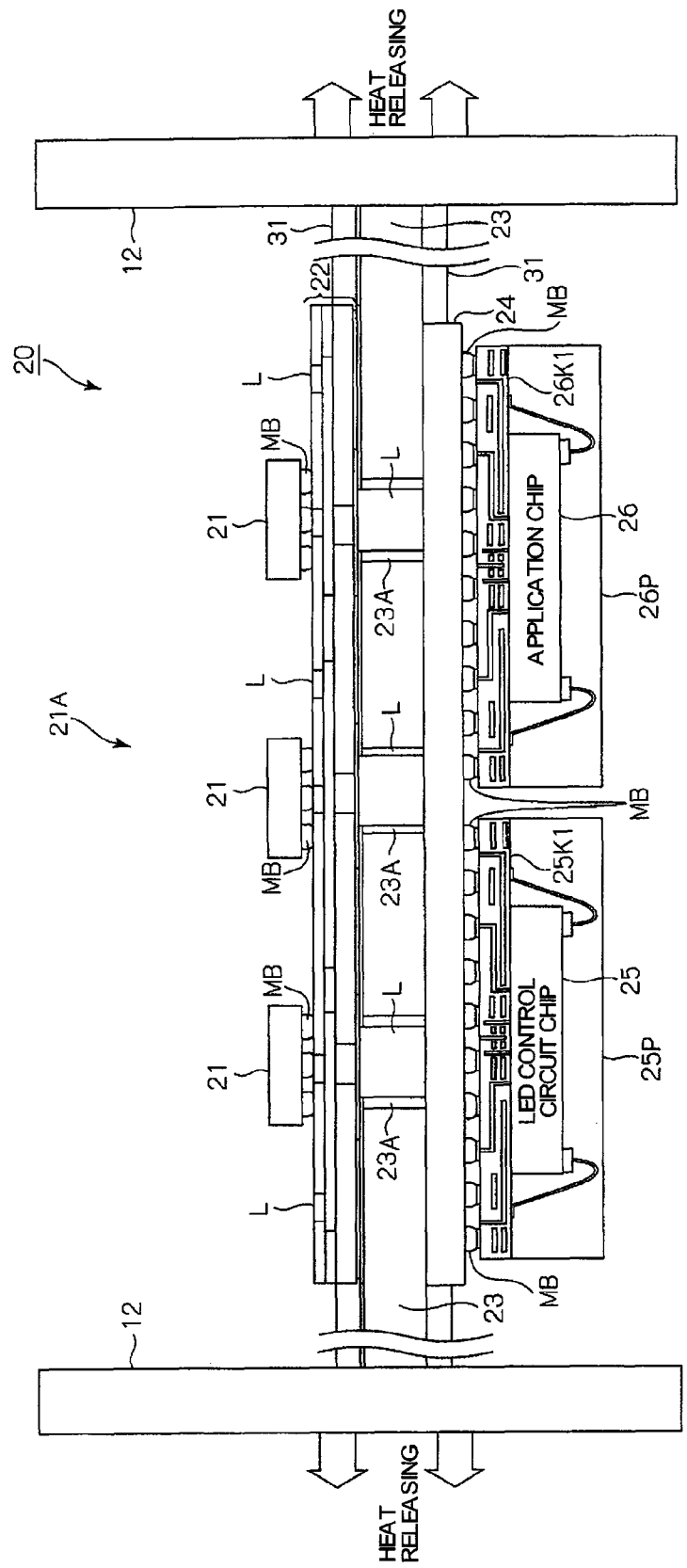
FIG. 3 is an enlarged sectional view of a detailed configuration of the three-dimensional silicon interposer.

FIG. 3 is an enlarged sectional view of a detailed configuration of the three-dimensional silicon interposer 20.

The three-dimensional silicon interposer 20 comprises an LED module 21A which comprises four LED elements 21, the first substrate 22, a heat insulation organic substrate 23, the second substrate 24, an LED control circuit chip 25, and an application chip 26.

The four LED elements 21 may have different luminescent colors from each other or all or part of them may have the same color. The LED elements 21 are mounted on the top surface of the first substrate 22 via micro bumps MB. The first substrate 22 has a plurality of hierarchical layers and it comprises a substrate which includes silicon (hereinafter referred to as "silicon substrate"). Also, two electrodes are disposed on one side of the LED elements 21 and micro bumps MB are connected to each of such two electrodes and the light is emitted from the opposite side of where the electrodes are connected.

The number of LED elements 21 may not be limited to particular number and it may be one or more than two or more than four. Also, the type of LED elements can be single-chip or multi-chip.

Also, each micro bump MB connected to the LED elements 21 are connected to the wiring L of the first substrate 22. The opposite side from the LED element-mounting side of the first substrate 22 is stuck to the heat insulation organic substrate 23.

The heat insulation organic substrate 23 is disposed between the first substrate 22 and the second substrate 24 and it insulates the first substrate 22 and the second substrate 24. Also, the heat insulation organic substrate 23 comprises through-holes 23A and the wiring L of the first substrate 22 and the wiring L of the second substrate 24 are connected via the through-holes 23A. Thus the LED elements 21 do not need to be connected by wire-bonding and there is no open-circuit problems caused by wire-bonding.

The second substrate 24 is composed of a generic organic substrate. On one side of the second substrate 24, the heat insulating organic substrate 23 is stuck. On the other side of the second substrate 24, the LED control circuit chip 25 is mounted via micro bumps and a substrate 25 K1, as well as an application chip 26 is mounted via micro bumps and a substrate 26 K1. Also the wiring inside the second substrate 24 is connected to the wiring L inside the through-holes 23A of the heat insulation organic substrate 23, as well as it is connected to the micro bumps MB which are connected to the LED control circuit chip 25 and the application chip 26.

The LED control circuit chip 25, for example, is composed of a BGA (Ball Grid Array) package. In concrete, the LED control circuit chip 25 is covered by a package 25P as well as it is wire-bonded with the substrate 25K1 and it is mounted on the second substrate 24 via micro bumps MB.

The application chip 26, for example, is composed of a BGA package. In concrete, the application chip 26 is covered by a package 26P as well as it is wire-bonded with the substrate 26K1 and it is mounted on the second substrate 24 via micro bumps MB.

The first substrate 22 and the second substrate 24 are connected to the aluminum die cast 12 via heat pipes 31 for heat release and conductance. The heat conducting and dissipating heat pipes 31 are mainly composed of aluminum and has a high heat conductivity.

Figure 4:
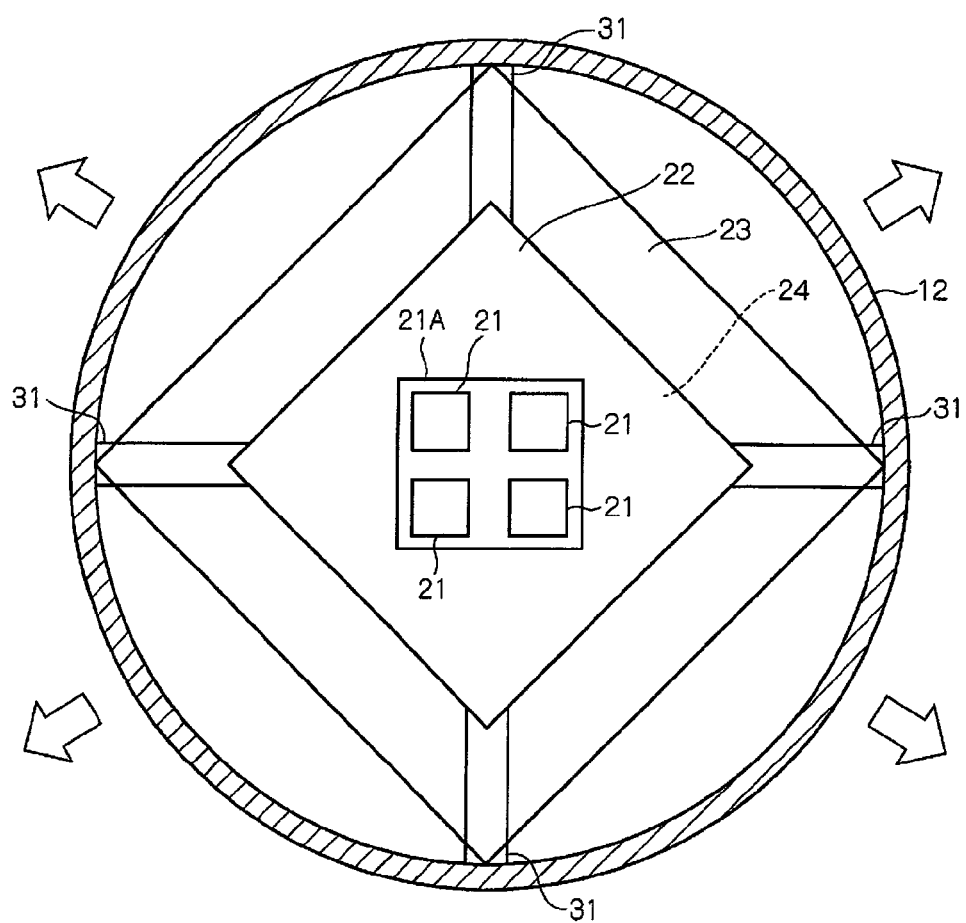
FIG. 4 is a plan view of the three-dimensional silicon interposer from the LED elements side of viewpoint.
Figure 5:
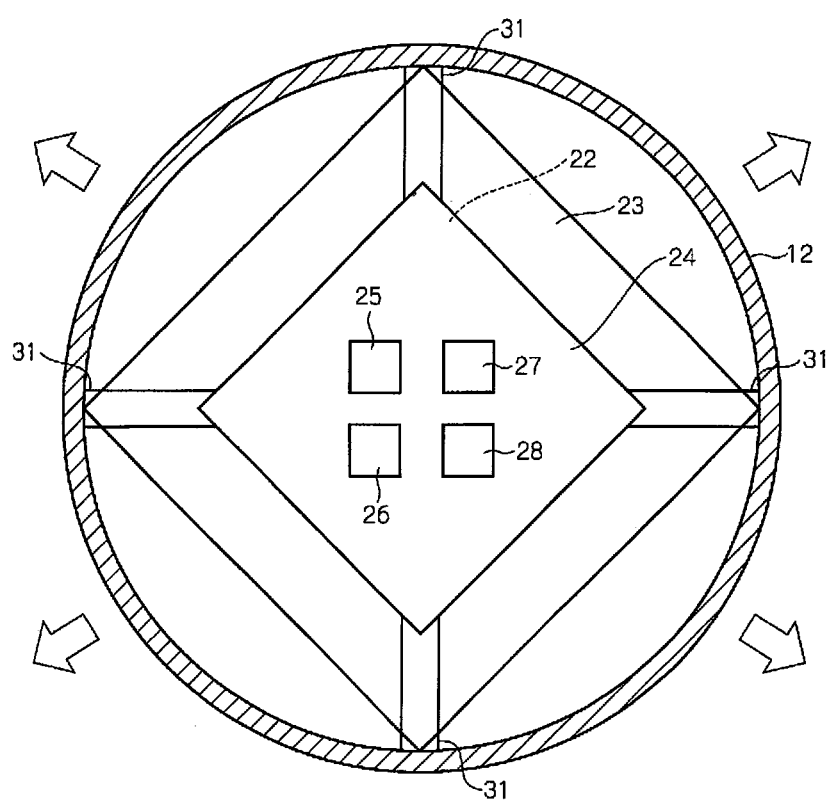
FIG. 5 is a plan view of the three-dimensional silicon interposer from the opposite side of the LED elements implementation side.

FIG. 4 is a plan view of the three-dimensional silicon interposer from the LED element side of viewpoint. FIG. 5 is a plan view of the three-dimensional silicon interposer from the opposite side of the LED element-mounting side. As shown in FIG. 5, on the opposite side of the LED element-mounting side of the second substrate 24, other than the LED control circuit chip 25 and the application chip 26, a sensor chip 27 and an application chip 28 are mounted via micro bumps. The sensor chip 27 and the application chip 28 are composed of a BGA package. Also, on the opposite side of the LED element-mounting side, other chips may be mounted and there is no need to limit to chips taken as an example here.

As for the LED lighting device with such a configuration, when the LED is lit, the LED control circuit chip 25 and a power circuit which is not indicated in the figure operate and the ELD elements 21 are lit without being affected by the operation of the application chip 26. As the circuit elements such as the application chip 26, the sensor chip 27, and the application chip 28 operate depending on the necessity (they can operate independently), it can be operated as an electronic appliance which utilizes the socket infrastructure.

On another note the electric conversion rate of the LED elements is about 10% and 90% is converted to heat. Thus, depending on the current value of the driving current which drives the LED elements, the temperature of the LED element may substantially increase. Therefore, the lifetime of the LED lighting device becomes extremely different depending on how the heat generated by the LED elements is released.

The first substrate 22 is composed including silicon and its heat conductivity is higher than general organic substrates and the heat is easily conducted. Therefore, the heat generated by the light emission of the LED elements 21 is conducted to the aluminum die cast 12 via the first substrate 22 and the heat conducting and dissipating heat pipes 31. Also, as the aluminum die cast 12 is mainly formed by aluminum which has high heat conductivity, the heat generated by the LED elements 21 is released from the aluminum die cast 12 as well as from the heat releasing unit 13.

Also, since the heat insulation organic substrate 23 is disposed between the first substrate 22 and the second substrate 24, the heat generated by the LED elements 21 is not conducted to the second substrate 24. Thus the LED control circuit chip 25, the application chip 26, 28, and the sensor chip 27 are not damaged by the heat.

As the diameter of the through-holes 23A of the heat insulation organic substrate 23 is, for example, from about 100-300 μm, the heat generated by the LED elements 21 is hardly conducted to the second substrate 24 via the wiring L of the through-holes 23A.

As stated above, the LED lighting device with these embodiments does not allow the heat to be conducted to the LED control circuit chip 25, the application chip 26 and so on by the heat insulation organic substrate 23, as well as it releases the heat externally via the first substrate 22 which has high heat conductivity.

As such, a chip to light the LED elements is configured by a single chip, and the LED elements 21, the LED control circuit chip 25, the application chip 26 and so on are not damaged by the heat, thus the lifetime is prolonged and the brightness is enhanced for the LED elements 21. Also, as the LED elements 21 are mounted on the first substrate 22, and there is no major difference in the coefficients of thermal expansion between the LED substrate and the first substrate 22, a crack may take place less.

Application chips 26 and 28 are not limited to any specific application in any of the embodiments but high-speed wireless LAN chips (e.g. Wifi), PHS signal relaying chips, TV/radio tuner chips are the examples. Also, the sensor chip 27 is not limited to any specific kind but motion sensors, magnetic sensors, thermal sensors, vibration sensors, image sensors, smoke sensors, electro-magnetic wave sensors, and earthquake sensors are the example. Also, the heat releasing unit 13 comprises a plurality of heat releasing fins 13a but as long as the element releases the heat, its configuration is not limited as such.

[Second Embodiment] Here, the second embodiment is explained. Same symbols are used for portions which are the same as the first embodiment and duplicating explanations are omitted. As for the first embodiment, the second substrate 24A was composed of a generic organic substrate. In the second embodiment, instead of the second substrate 24, the second substrate 24A which is composed of a silicon substrate is utilized.

Figure 6:
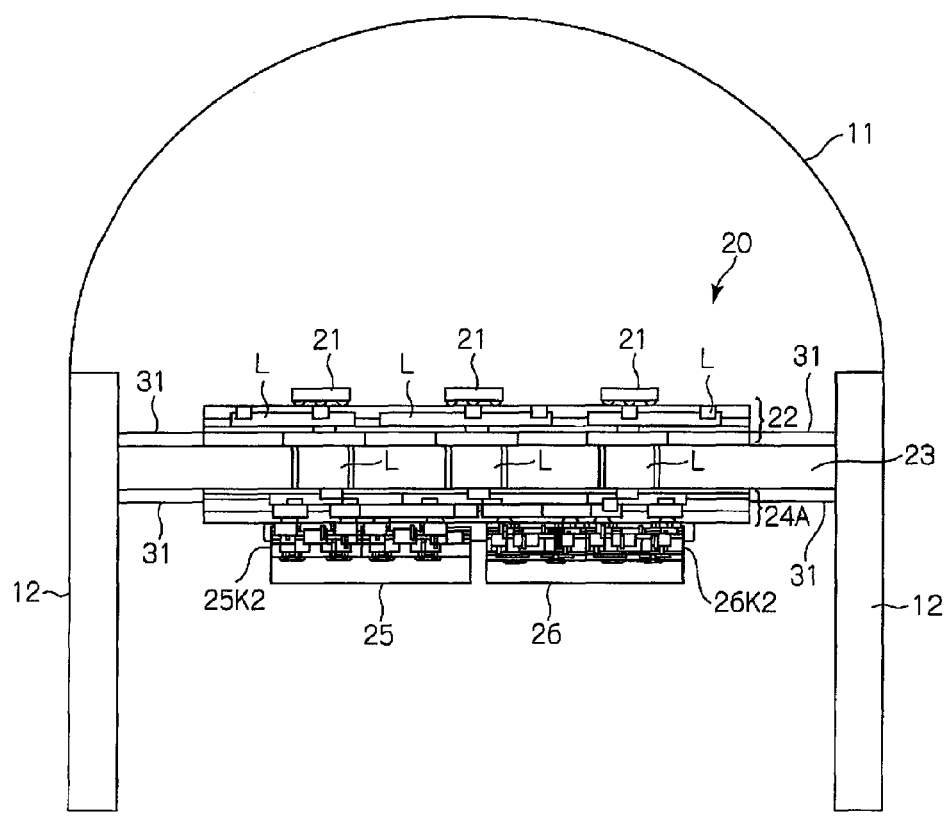
FIG. 6 is a sectional view of a detailed configuration of the three-dimensional silicon interposer in which the present invention is implemented as the second embodiment.
Figure 7:
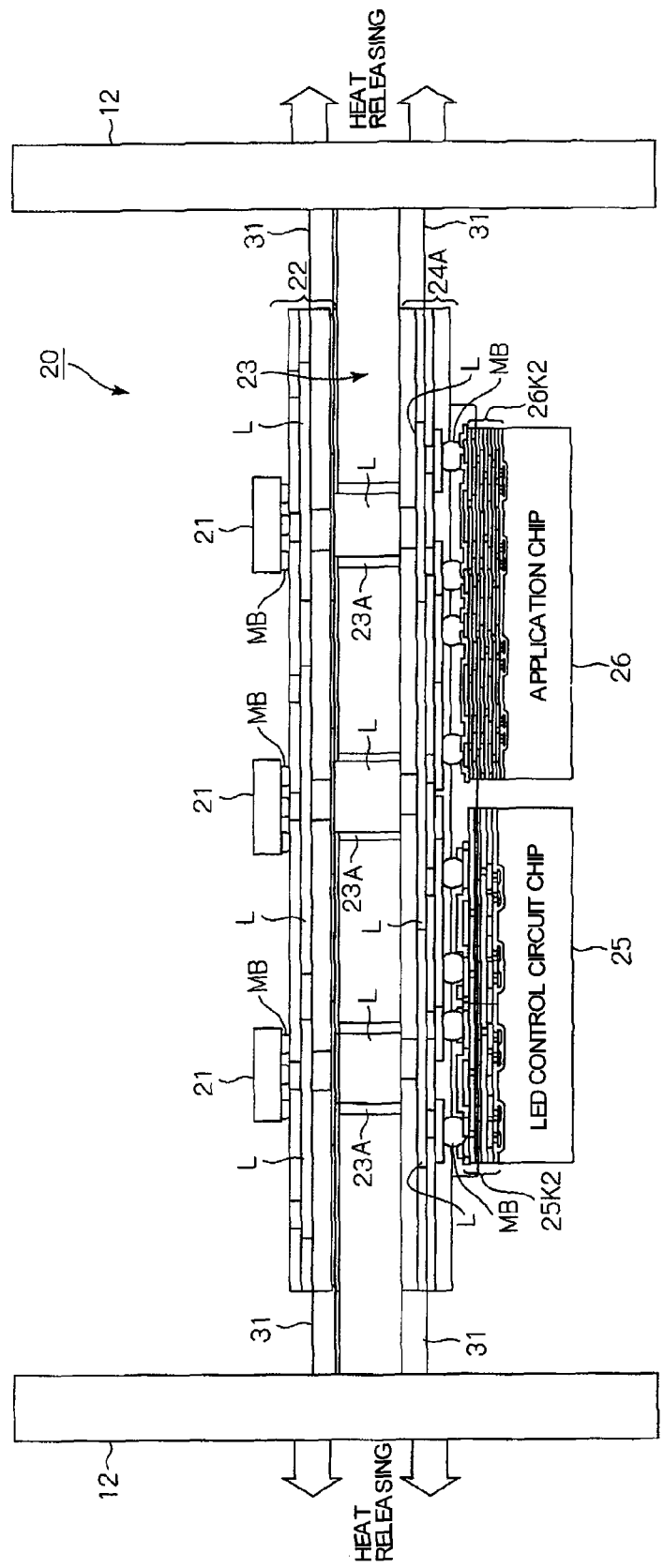
FIG. 7 is an enlarged sectional view showing a detailed configuration of the three-dimensional silicon interposer 20.

FIG. 6 is a sectional view of a detailed configuration of the three-dimensional silicon interposer 20. FIG. 7 is an enlarged sectional view of a detailed configuration of the three-dimensional silicon interposer 20.

The second substrate 24A, similarly to the first substrate 22, comprises a plurality of hierarchical layers. Also, the wiring L inside the second substrate 24A is connected to the wiring L inside the through-holes 23A of the heat insulation organic substrate 23, as well as it is connected to the LED control circuit chip 25 via micro bumps MB and the substrate 25K2, and further connected to the application chip 26 via micro bumps MB and the substrate 26K2.

Due to such a configuration, the LED lighting device which relates to the second embodiment releases the heat externally via the heat conducting and dissipating heat pipes 31, the aluminum die cast 12, and the heat releasing unit 13 even if the heat is generated at the second substrate 24 due to operations of the LED control circuit chip 25, the application chip 26 and so on. Thus each chip mounted on the second substrate 24 is not destroyed by the heat.

Also, the three-dimensional silicon interposer 20 has a single-chip configuration, and it efficiently releases not only the heat generated by the LED elements 21 and conducted to the first substrate 22 but also the heat generated by the LED control circuit chip 25, the application chip 26 and so on and conducted to the second substrate 24. Thus the second embodiment can be applied to a relatively small caliber of LED lighting device such as the caliber of E17 and the lifetime of the LED lighting device with a small caliber is prolonged.

[Third Embodiment] Next the third embodiment is explained. Same symbols are used for portions which are previously mentioned and duplicating explanations are omitted.

Figure 8:
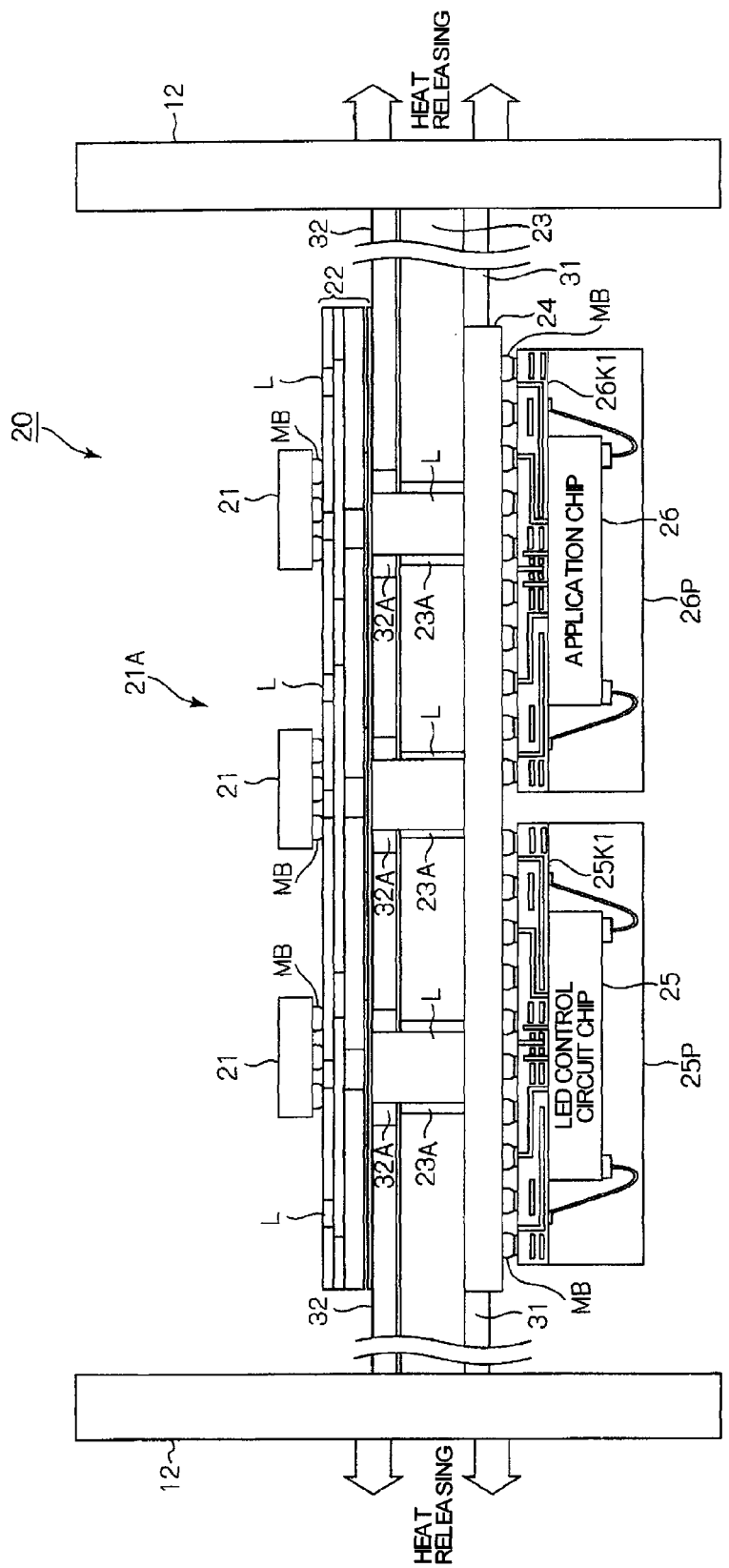
FIG. 8 is an enlarged sectional view of a detailed configuration of the three-dimensional silicon interposer in which the present invention is implemented as the third embodiment.

FIG. 8 is an enlarged sectional view of a detailed configuration of the three-dimensional silicon interposer 20 which relates to the third embodiment. In the first embodiment, the heat from the first substrate 22 was conducted to the aluminum die cast 12 via the heat conducting and dissipating heat pipes 31. In the third embodiment, the heat from the first substrate 22 is conducted to the aluminum die cast 12 via a heat conducting and dissipating aluminum substrate 32.

The heat conducting and dissipating aluminum substrate 32 is disposed between the heat insulation organic substrate 23 and the first substrate 22. The surface of the heat conducting and dissipating aluminum substrate 32 is covered by an insulating material (for example, oxide film). Instead of covering the surface of the heat conducting and dissipating aluminum substrate 32 by such a material, the surface of the first substrate 22 may be covered by such an insulating material. Also, the heat conducting and dissipating aluminum substrate 32 is stuck on top of the heat insulation organic substrate 23, as well as it is joined to the aluminum die cast 12. Also, the heat conducting and dissipating aluminum substrate 32 comprises a through-hole 32A. The wiring L of the first substrate 22 is connected to the wiring of the second substrate 24 through the through-hole 32A of the heat conducting and dissipating aluminum substrate 32 and the through-holes 23A of the heat insulation organic substrate 23.

Figure 9:
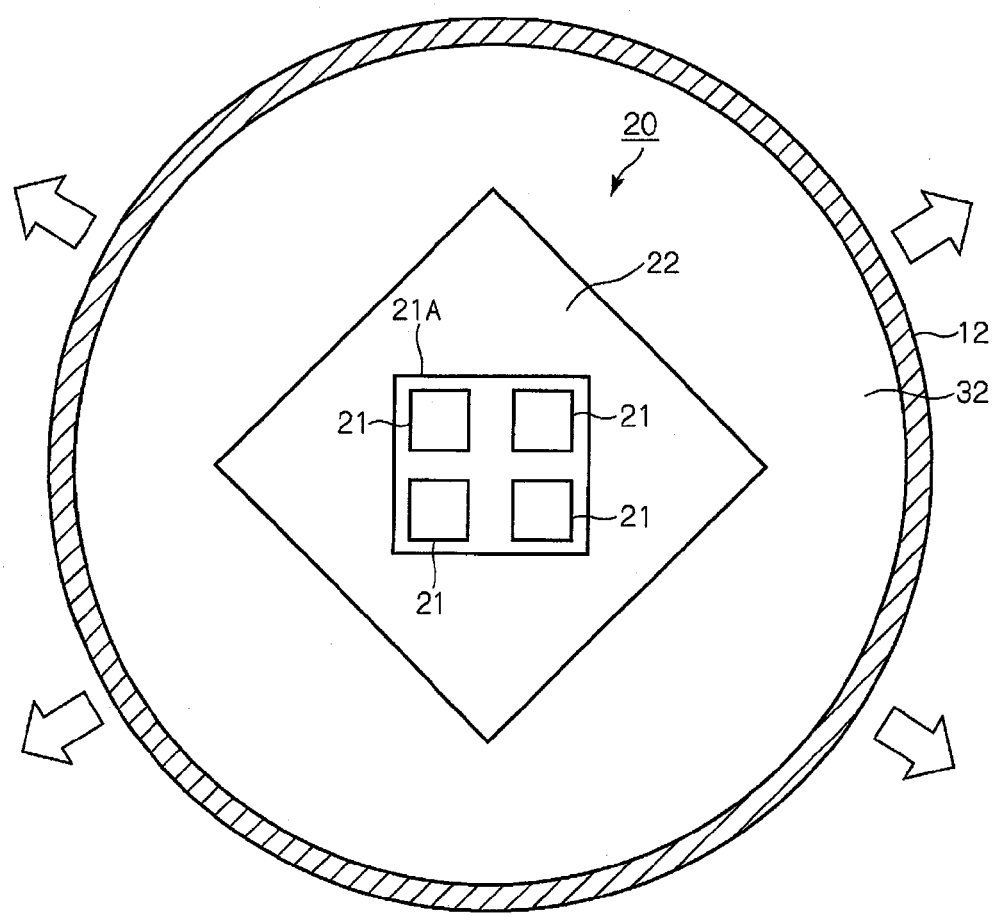
FIG. 9 is a plan view of the three-dimensional silicon interposer from the LED elements side of view point.
Figure 10:
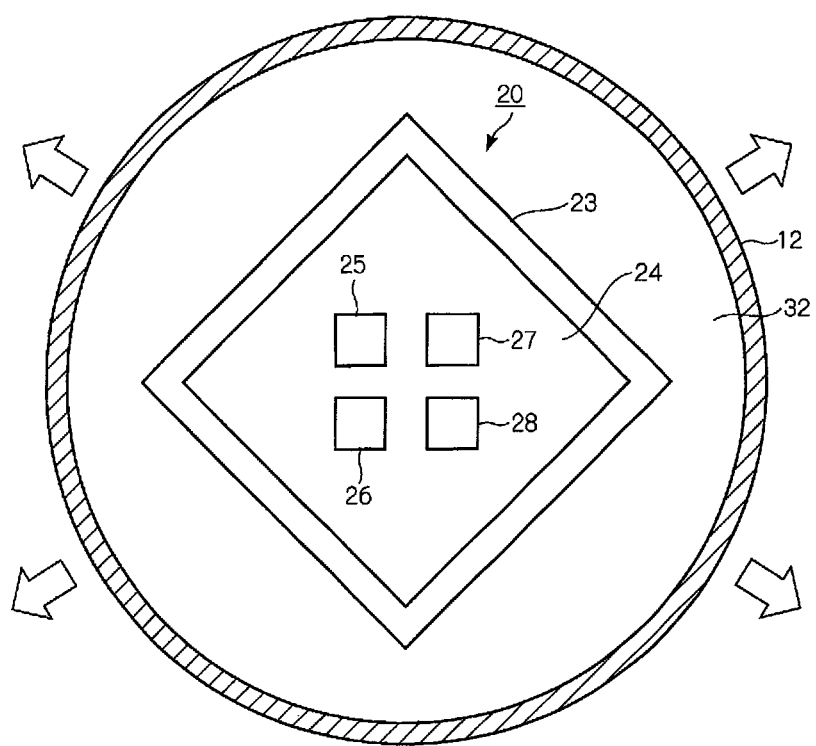
FIG. 10 is a plan view of the three-dimensional silicon interposer from the opposite side of the LED elements implementation side.

FIG. 9 is a plan view of the three-dimensional silicon interposer 20 from the LED element side of view point. FIG. 10 is a plan view of the three-dimensional silicon interposer 20 from the opposite side of the LED element-mounting side. In this embodiment, as shown in the FIG. 9 and FIG. 10, the heat conducting and dissipating aluminum substrate 32 forms a cylinder and the edge of the heat conducting and dissipating aluminum substrate 32 is joined to the inside of the aluminum die cast 12. However as long as the heat conducting and dissipating aluminum substrate 32 is joined to the aluminum die cast 12 and the heat conducting and dissipating aluminum substrate 32 is able to conduct the heat to aluminum die cast 12, the shape of the heat conducting and dissipating aluminum substrate 32 is not limited to this particular form.

As shown in FIG. 9, the first substrate 22 is stuck on the top of the heat conducting and dissipating aluminum substrate 32. Also as shown in FIG. 8, a plurality of through-holes 32A are formed on the heat conducting and dissipating aluminum substrate 32 to connect the wiring L inside the first substrate 22 and the wiring L of the second substrate 24.

Due to such configuration, when the heat generated by the LED elements 21 is conducted the first substrate 22, the heat conducting and dissipating aluminum substrate 32 receives the heat of the first substrate 22 with its entire surface and conducts the heat to the aluminum die cast 12.

Thus the LED lighting device which relates to the third embodiment realizes a longer-lifetime and enhanced brightness of the LED elements 21 since the heat generated at the first substrate 22 due to the light emission by the LED elements 21 is absorbed by the entire surface of the heat conducting and dissipating aluminum substrate 32, and it is conducted to the aluminum die cast 12 for dissipation.

In the explanation above, a case when the second substrate is a generic organic substrate (modified example of the first embodiment) is taken as an example and the same may be applied when the second substrate 24A which is a silicon substrate is utilized (modified example of the second embodiment).

Figure 11:
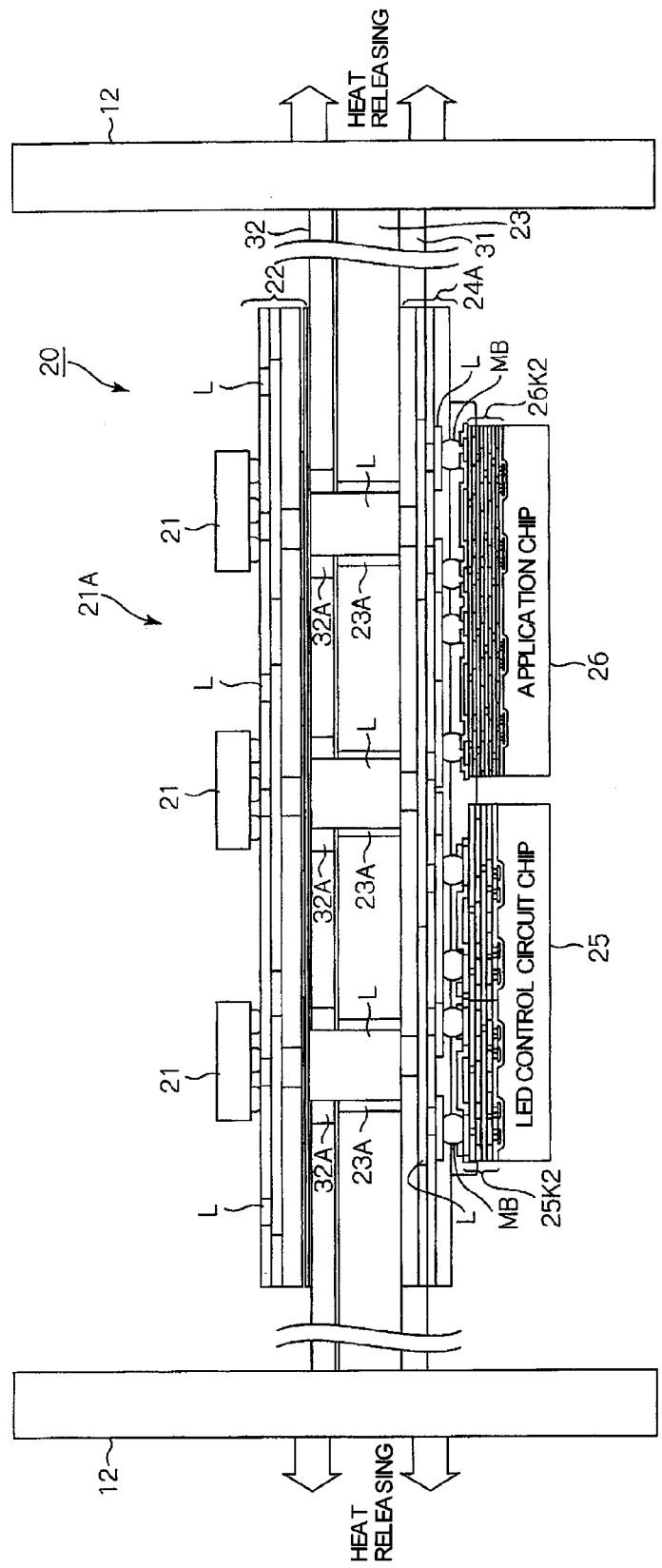
FIG. 11 is an enlarged sectional view of a detailed configuration of the three-dimensional silicon interposer when the second substrate which is a silicon substrate is utilized.

FIG. 11 is an enlarged sectional view of a detailed configuration of the three-dimensional silicon interposer 20 when the second substrate 24A which is a silicon substrate is utilized. In this case, the heat of the first substrate 22 is received by the entire surface of the heat conducting and dissipating aluminum substrate 32, and it is conducted to the aluminum die cast 12. Since the second substrate 24 has a high heat conductivity, it efficiently conducts the heat generated by the operations of the LED control circuit chip 25, application chip 26 and so on to the heat conducting and dissipating heat pipes 31 and the heat is released externally via the aluminum die cast 12.

[Fourth Embodiment] Next explanation is on the forth embodiment. Same symbols are used for portions which are previously mentioned and duplicating explanations are omitted. The first to third embodiments explained the light bulb form. The forth embodiment takes the linear tube fluorescent light form.

Figure 12:
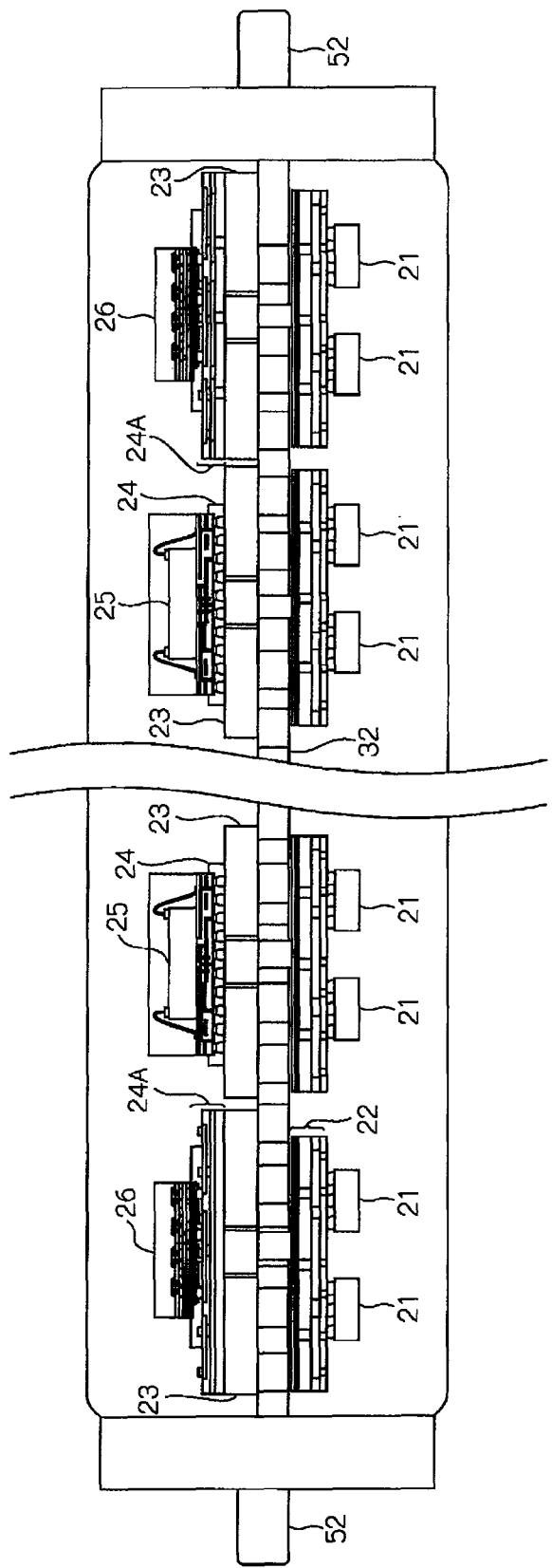
FIG. 12 is a longitudinal sectional view of the LED lighting device in which the present invention is implemented as the fourth embodiment.
Figure 13:
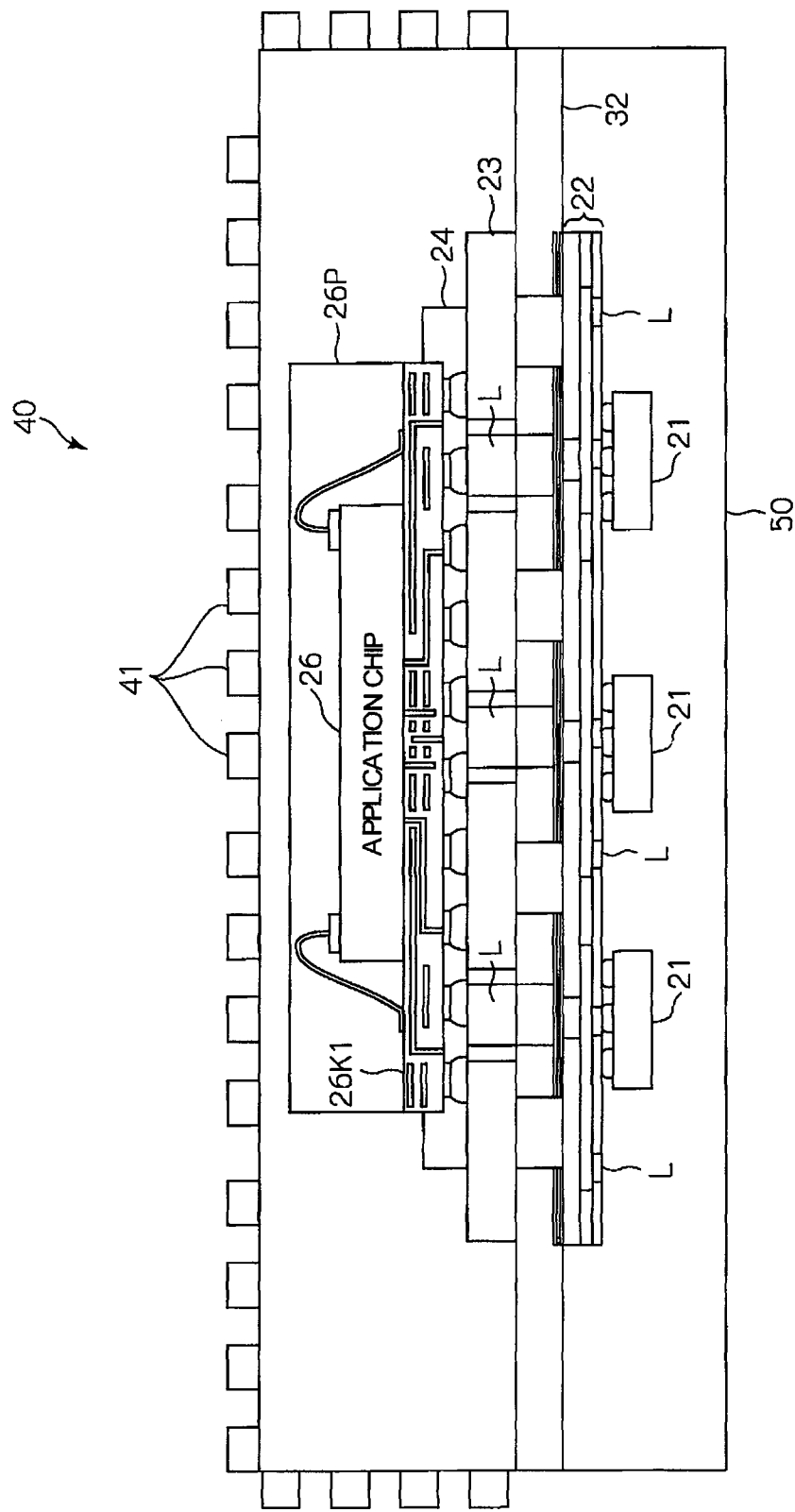
FIG. 13 is a sectional view of the LED lighting device in the direction orthogonal to the longitudinal direction.

FIG. 12 is a longitudinal sectional view of the LED lighting device for the fourth embodiment. FIG. 13 is a sectional view of the LED lighting device in the direction orthogonal to the longitudinal direction. As such, the LED light device for this embodiment has almost a similar configuration compared to the third embodiment but the disposition of each element is different to fit the linear tube fluorescent light form.

The LED lighting device, as shown in FIG. 13, comprises the heat releasing element 40 which comprises a plurality of heat releasing fins 41, an acrylic lens 50 which transmits the light of the LED elements 21 externally, and the heat conducting and dissipating aluminum substrate 32 which is tucked inside the heat releasing element 40 and the acrylic lens 50. As long as the light of the LED elements 21 is transmitted externally, the LED lighting device may utilize other transmission material instead of the acrylic lens 50.

The heat releasing element 40 and the acrylic lens 50 are in a form of pair of boxes and it includes the heat conducting and dissipating aluminum substrate 32 which is formed in the longitudinal direction. Thus, as shown in FIG. 13, the cut side of the heat releasing element 40 is in a rectangular form and a plurality of heat releasing fins 41 are disposed on the outside of the heat releasing element 40. Also, the edge in the longitudinal direction of the heat conducting and dissipating aluminum substrate 32 is joined to the opening of the heat releasing element 40. Thus one side (on the side of the second substrate 24) of the heat conducting and dissipating aluminum substrate 32 is covered by the heat releasing element 40.

The cut side of the acrylic lens 50 is, similar to the heat releasing element 40, in a rectangular form. The acrylic lens 50 is joined to the edge of the heat releasing element 40 in such a manner that the other side (on the side of the first substrate 22) of the heat conducting and dissipating aluminum substrate 32 is covered. Further, as shown in FIG. 12, a pair of terminals 52 to which the power is supplied are disposed on the both sides in the longitudinal direction and the terminals 52 are connected to the wirings of the first substrate 22 and the second substrate 24.

Figure 14:
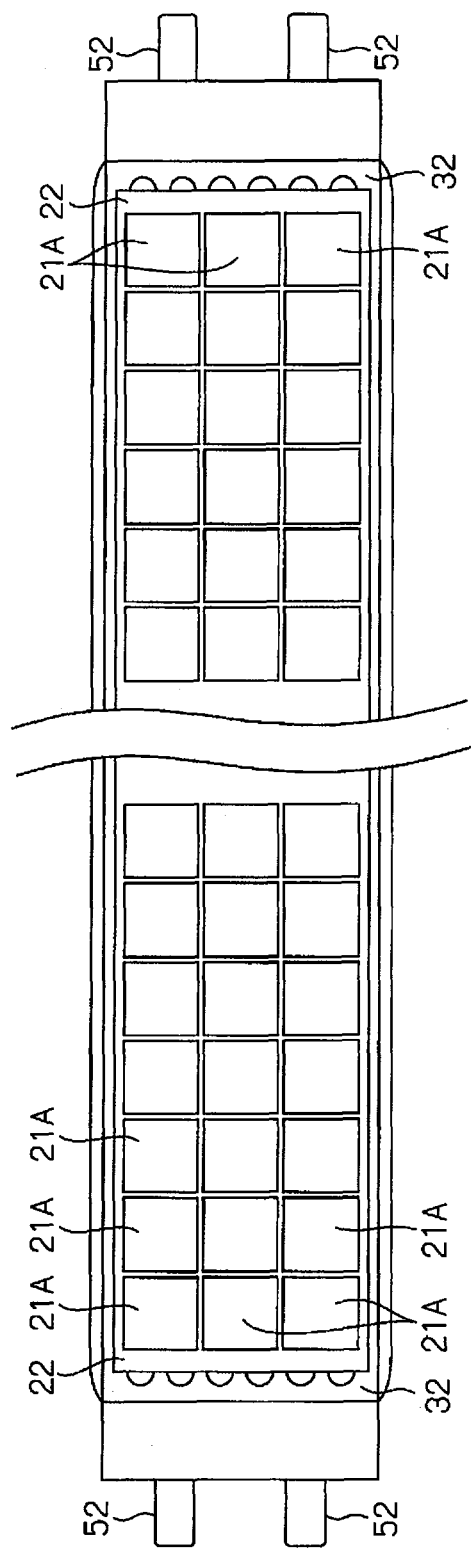
FIG. 14 is a plan view of the LED lighting device from the LED elements side of view point.

FIG. 14 is a plan view of the LED lighting device from the LED element side of view point. The first substrate 22 on which a plurality of LED modules 21A are mounted in a matrix form is stuck in such a manner that it covers one side of the heat conducting and dissipating aluminum substrate 32. Also as shown in FIG. 12, on the other side of the heat conducting and dissipating aluminum substrate 32, the second substrates 24 and 24A on which the LED control circuit chip 25 and the application chip 26 are mounted are stuck in the longitudinal direction of the heat conducting and dissipating aluminum substrate 32. The alignment of the first substrate 22, the second substrate 24, and 24A is not limited to the example stated above. For example, various modules may be mounted on the opposite side of the LED-mounting side of the heat conducting and dissipating aluminum substrate 32.

Figure 15:
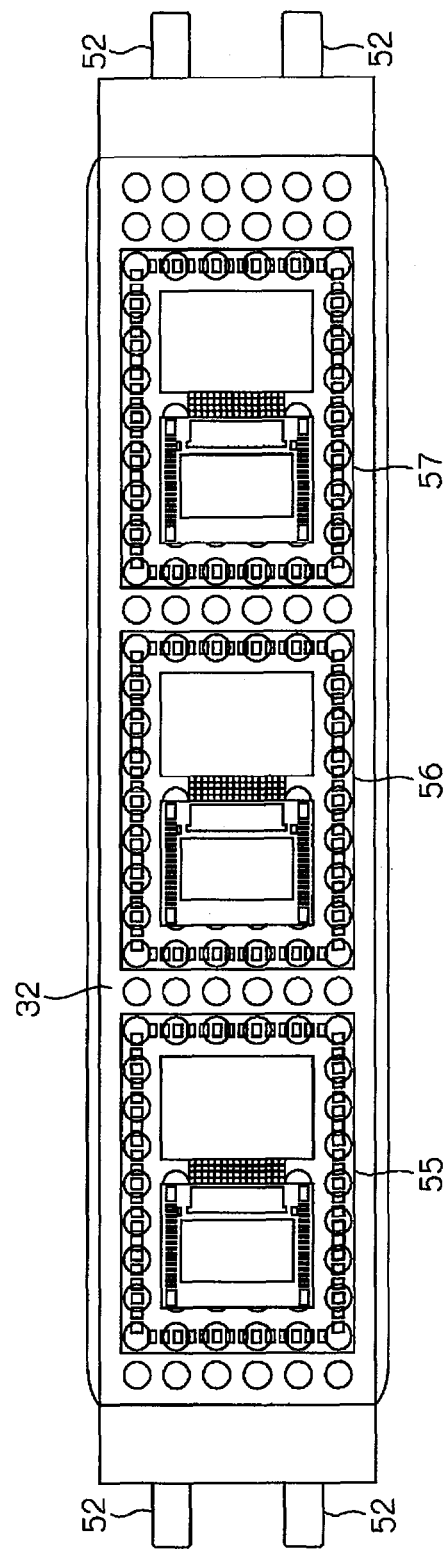
FIG. 15 is a plan view of the LED lighting device from the opposite side of the LED implementation side.

FIG. 15 is a plan view of the LED lighting device from the opposite side of the LED-mounting side. The LED control module 55, the wireless module 56, and the graphic processing module 57 are stuck in the longitudinal direction of the heat conducting and dissipating aluminum substrate 32.

With the LED lighting device with the configuration, when the LED elements 21 emit light, the light is transmitted externally through the acrylic lens 50. Also, the heat generated by the LED elements 21 is conducted to the heat releasing element 40 via the first substrate 22 and the heat conducting and dissipating aluminum substrate 32 and it is released from a plurality of heat releasing fins 41.

As such, as for the LED lighting device relates to the fourth embodiment, many LED elements 21 are disposed on the heat conducting and dissipating aluminum substrate 32, and a thinner model of the linear tube fluorescent light is realized compared to general models of linear tube fluorescent lights. The LED lighting device is not limited to the examples previously stated and may take a following configuration.

Figure 16:
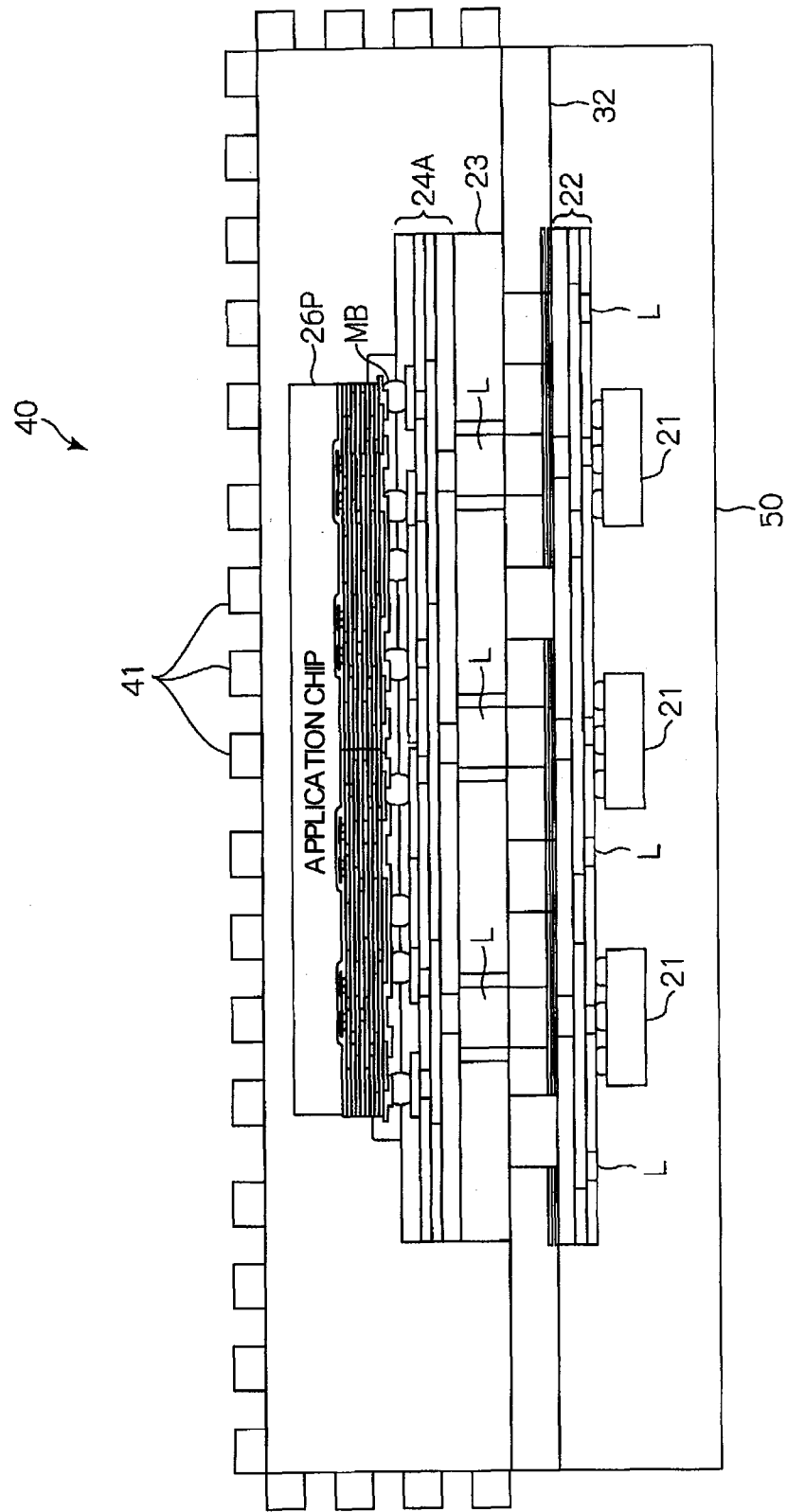
FIG. 16 is a sectional view of the LED lighting device in the direction orthogonal to the longitudinal direction when the second substrate is a silicon substrate.

FIG. 16 is a sectional view of the LED lighting device in the direction orthogonal to the longitudinal direction when the second substrate 24A is a silicon substrate. As shown in the figure, the application chip 26 is mounted on the second substrate 24 via micro bumps MB. Also, since the application chip 26 and other chips are not in BGA package, they are thinner compared to BGA packaged chips. Thus the LED lighting device is also thin.

Figure 17:
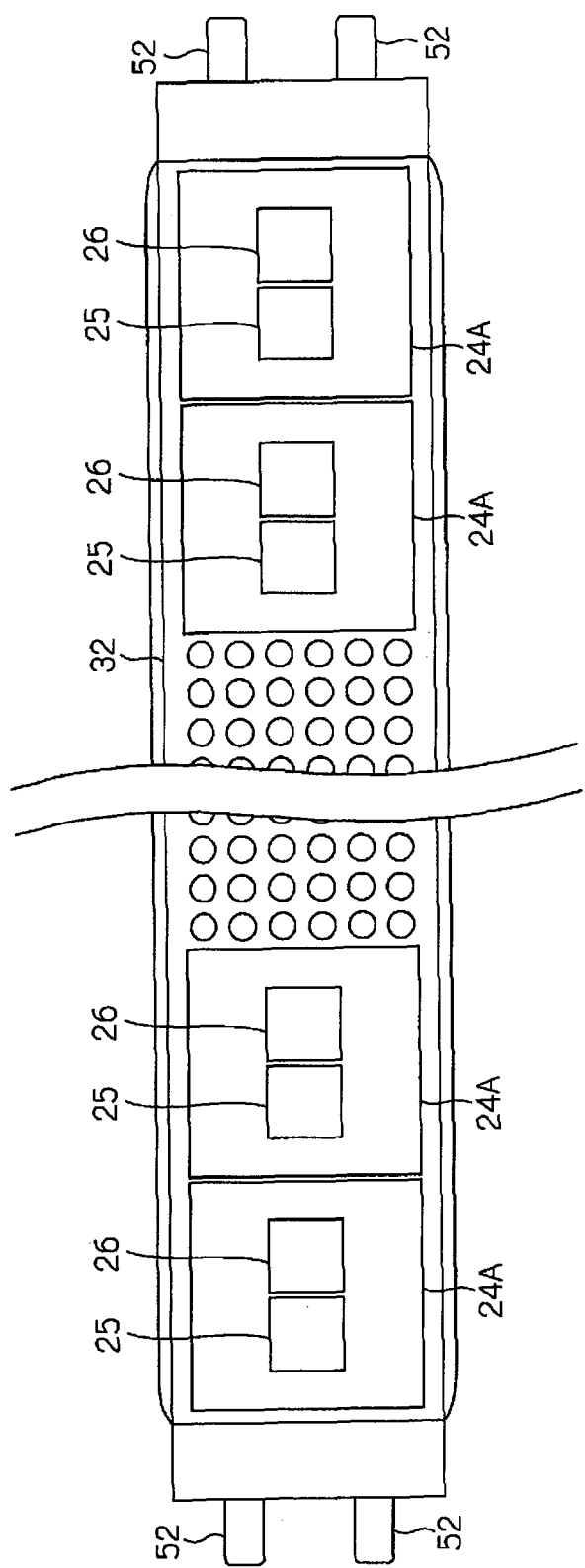
FIG. 17 is a plan view of the LED lighting device which is on the opposite side of the LED implementation side.

FIG. 17 is a plan view of the LED lighting device which is on the opposite side of the LED-mounting side. As shown in the FIG. 17, the second substrate 24A on which the LED control circuit chips 25 and the application chips 26 are mounted is stuck on top of the heat conducting and dissipating aluminum substrate 32 in the longitudinal direction of the heat conducting and dissipating aluminum substrate 32. Also, the LED lighting device may take a form as follows.

Figure 18:
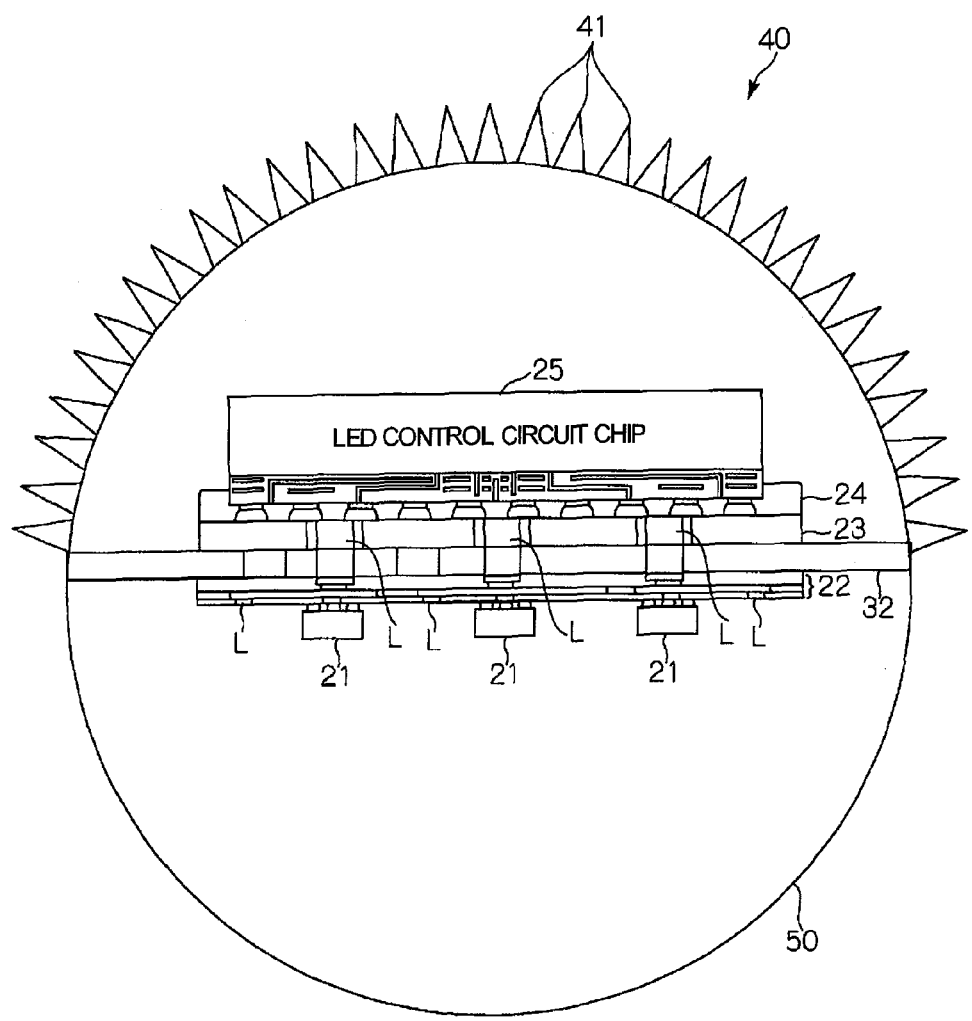
FIG. 18 is a sectional view of the LED lighting device in the direction orthogonal to the longitudinal direction.

FIG. 18 is a sectional view of the LED lighting device in the direction orthogonal to the longitudinal direction. This LED lighting device has the same form as conventional linear tube fluorescent light. Therefore the cut sides of the heat releasing element 40 and the acrylic lens 50 are in the shape of a half circle.

[Fifth Embodiment] Next explanation is on the fifth embodiment. Same symbols are used for portions which are previously mentioned and duplicating explanations are omitted.

Figure 19:
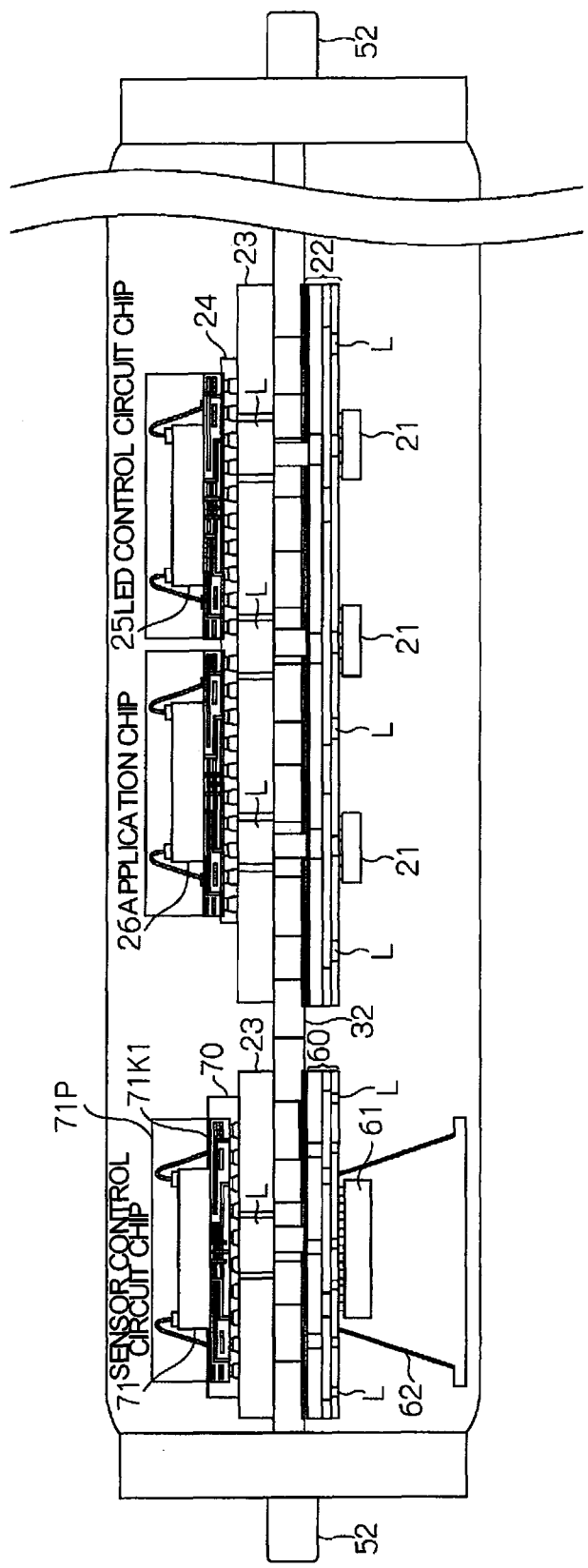
FIG. 19 is a longitudinal sectional view of the LED lighting device in which the present invention is implemented as the fifth embodiment.
Figure 20:
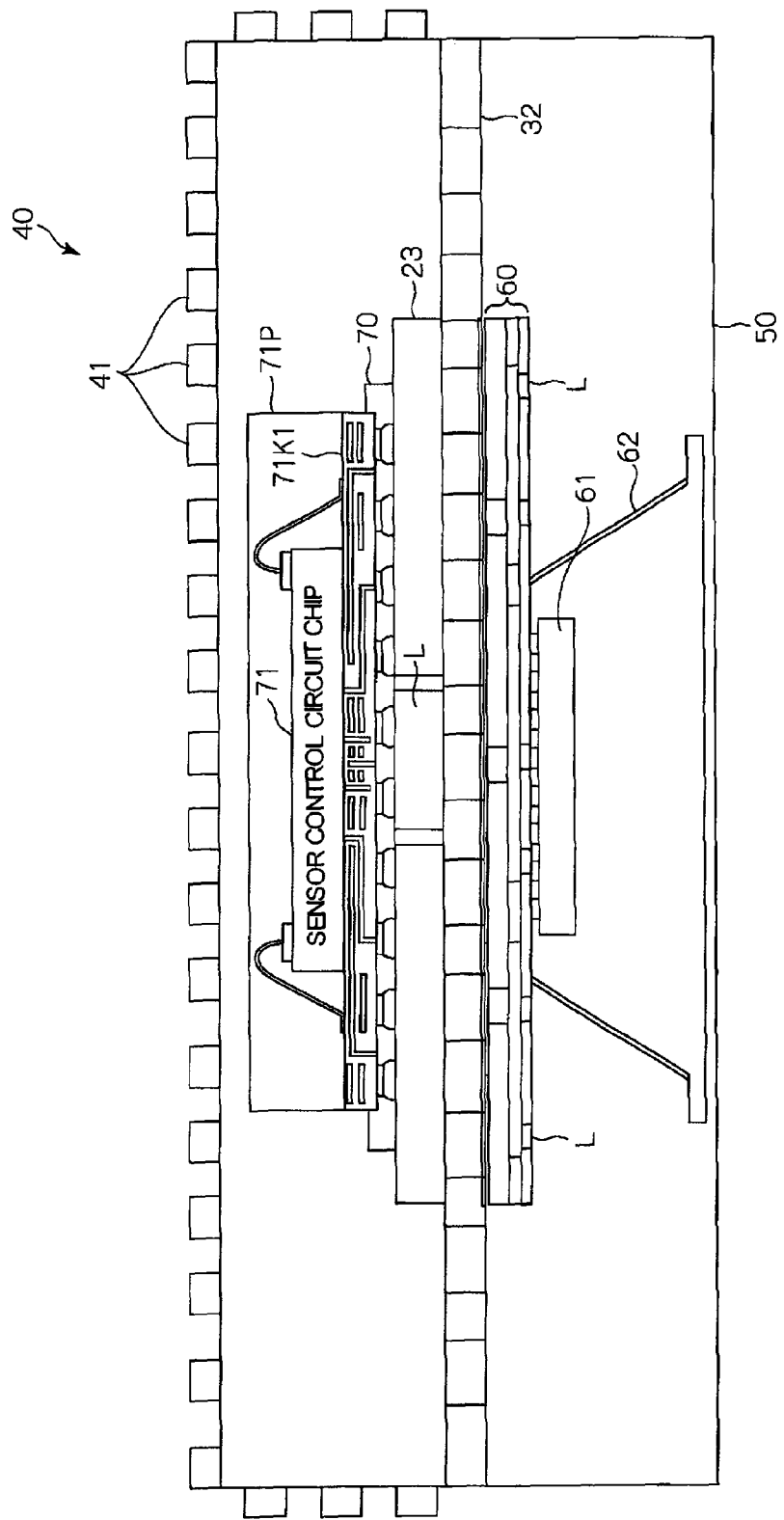
FIG. 20 is a sectional view of the LED lighting device in the direction orthogonal to the longitudinal direction.

FIG. 19 is a longitudinal sectional view of the LED lighting device of the fifth embodiment. FIG. 20 is a sectional view of the LED lighting device in the direction orthogonal to the longitudinal direction. In other words, the LED lighting device which relates to this embodiment is adding a sensor 61 as well as a sensor control circuit chip 71 which controls the sensor to the fourth embodiment configuration.

The sensor 61 is mounted on the sensor substrate 60 which is comprised of a silicon substrate and is connected to the wiring L inside the sensor substrate 60 via micro bumps MB. Also, around the sensor 61, a shading hood 62 is disposed. Also, the sensor 61 is not limited to a certain sensor and it may be a thermal sensor, CMOS sensor, CCD sensor, and so on. The sensor substrate 60 is stuck to the heat conducting and dissipating aluminum substrate 32 in the same manner as the first substrate 22.

The sensor control circuit chip 71 is a chip to control the sensor 61 and for example, is in a BGA package. In concrete, the sensor control circuit chip 71 is covered by a package 71P as well as it is wire-bonded with the substrate 71K and is mounted on the control circuit chip substrate 70 via micro bumps MB. And the power is supplied to the sensor 61 and the sensor control circuit chip 71 via the terminals 52.

With such configuration, since the LED lighting device related to the fifth embodiment comprises the sensor 61, it is possible to detect people or objects without being recognized by people. Also, if the sensor 61 is a graphic sensor, the LED light device is capable of storing the graphic information generated by the sensor 61 in the memory which is in the application chip 26, compressing the graphic information and transmitting it externally via wireless communication.

Figure 21:
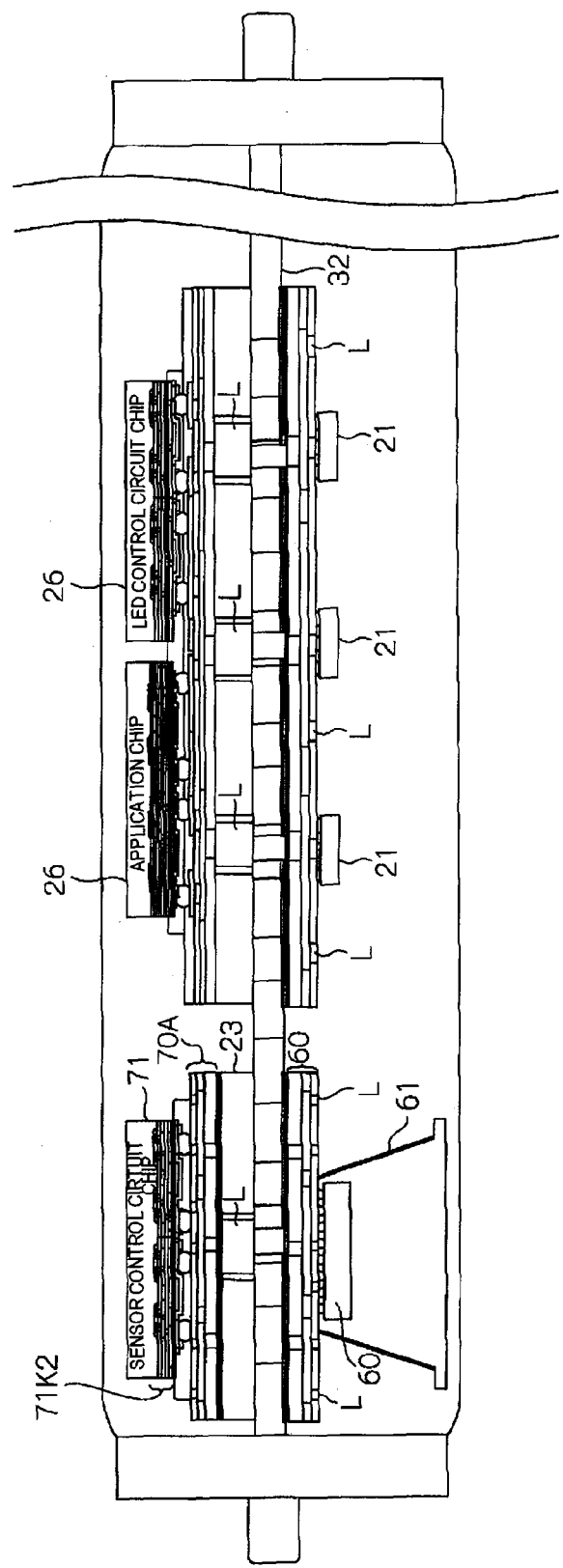
FIG. 21 is a sectional view of the LED lighting device in the longitudinal direction when the control circuit chip substrate is a silicon substrate.
Figure 22:
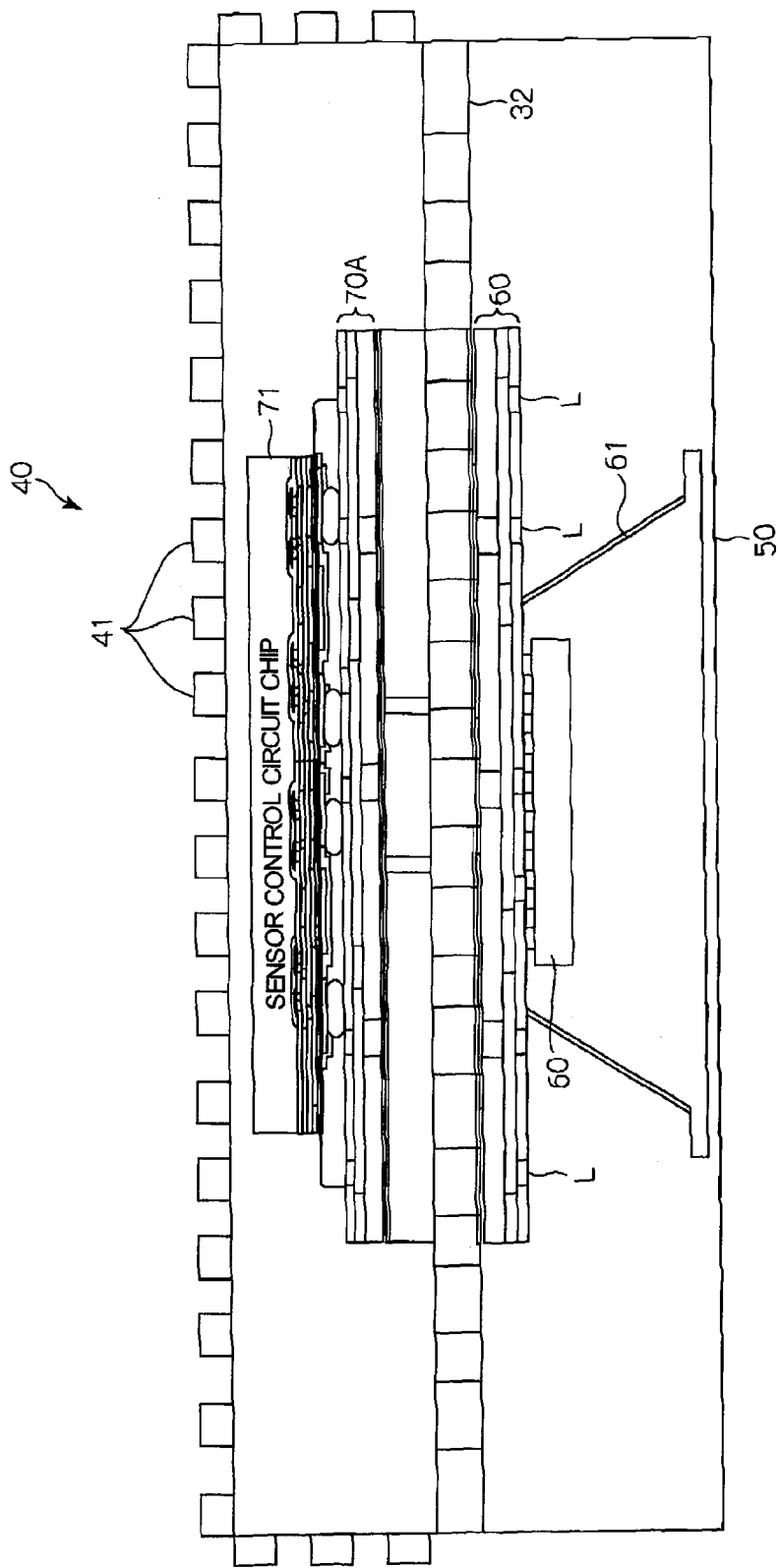
FIG. 22 is a sectional view of the LED lighting device in the direction orthogonal to the longitudinal direction.

FIG. 21 is a sectional view of the LED lighting device in the longitudinal direction when the control circuit chip substrate 70A is a silicon substrate. FIG. 22 is a sectional view of the LED lighting device in the direction orthogonal to the longitudinal direction. In this case, the sensor control circuit chip 71 is mounted on the control circuit chip substrate 70A which is a silicon substrate via the substrate 71K2 and the micro bumps MB. In other words, this LED lighting device is applicable when the control circuit chip substrate 70A is a silicon substrate.

This invention is not limited to the embodiments previously explained but it is applicable to the designs changed within the scope of items which are set forth in the Claims. For example, in the embodiments previously explained, the three-dimensional silicon interposer 20 was joined to the aluminum die cast 12 via the heat conducting and dissipating heat pipes 31 but it may be directly joined to the aluminum die cast 12.

Also, in each of the embodiments previously explained, as a silicon substrate which comprises the first substrate 22, the second substrate 24, the sensor substrate 60, and the control circuit chip substrate 70, an amorphous silicon substrate can be used. When the LED elements 21 emit light, the electronic energy obtained from the amorphous silicon substrate may be supplied to the LED elements 21 and other chips.

INDUSTRIAL APPLICABILITY

The present invention is applicable to a three-dimensional LED substrate as well as an LED lighting device.

REFERENCE SIGNS LIST 11 globe
12 aluminum die cast
13 heat releasing element
14 metal cap
20 three-dimensional silicon interposer
21 LED element
22 first substrate
23 heat insulation organic substrate
24 second substrate
25 LED control circuit chip
26 application chip

The invention claimed is:

1. An LED lighting device comprising:
a three-dimensional LED substrate that includes: at least one LED element; a silicon substrate to one side of which the LED element is mounted via micro bumps, the silicon substrate having internally formed wiring connected to the micro bumps; a heat insulation organic substrate which is stuck to a side of the silicon substrate opposite the LED element, the heat insulation organic substrate having through-holes traversed by the wiring of the silicon substrate; a chip-mounting substrate which is stuck to a side of the heat insulation organic substrate opposite the silicon substrate, wiring of the chip-mounting substrate being connected to the wiring of the silicon substrate in the through-holes of the heat insulation organic substrate; an LED control circuit chip which is connected to the wiring of the chip-mounting substrate via micro bumps, and mounted, via such micro bumps, on a side of the chip-mounting substrate opposite the heat insulation organic substrate; and an application chip connected to the wiring of the chip-mounting substrate via micro bumps, and mounted, via such micro bumps, on a side of the chip-mounting substrate opposite the heat insulation organic substrate;
a heat releasing unit which includes aluminum and is formed so as to surround an edge of the three-dimensional LED substrate;
a heat conductive unit which includes aluminum, is joined respectively to the heat releasing unit and an outside edge of the silicon substrate, and conducts heat from the silicon substrate to the heat releasing unit;
a globe which is formed so as to cover an LED-mounting side of the three-dimensional LED substrate at an opening of the heat releasing unit; and
a metal cap which is connected to the heat releasing unit.

2. The LED lighting device according to claim 1,
wherein the chip-mounting substrate is a silicon substrate, which is joined to the heat releasing unit via the heat conductive unit which is joined to an outside edge of the silicon substrate and conducts heat from the application chip to the heat releasing unit via the heat conductive unit.

3. The LED lighting device according to claim 1,
wherein the three-dimensional LED substrate has a sensor chip which is connected to the wiring of the chip-mounting substrate via micro bumps and mounted, via such micro bumps, to a side of the chip-mounting substrate opposite the heat insulation organic substrate.

4. An LED lighting device comprising:
a three-dimensional LED substrate that includes: at least one LED element; a silicon substrate to one side of which the LED element is mounted via micro bumps, the silicon substrate having internally formed wiring connected to the micro bumps; a heat insulation organic substrate which is stuck to a side of the silicon substrate opposite the LED element, the heat insulation organic substrate having through-holes traversed by the wiring of the silicon substrate; a chip-mounting substrate of silicon which is stuck to a side of the heat insulation organic substrate opposite the silicon substrate, wiring of the chip-mounting substrate being connected to the wiring of the silicon substrate in the through-holes of the heat insulation organic substrate; an LED control circuit chip which is connected to the wiring of the chip-mounting substrate via micro bumps, and mounted, via such micro bumps, on a side of the chip-mounting substrate opposite the heat insulation organic substrate; an application chip connected to the wiring of the chip-mounting substrate via micro bumps, and mounted, via such micro bumps, on a side of the chip-mounting substrate opposte the heat insulation organic substrate; and an aluminum substrate which is disposed between the silicon substrate and the heat insulation organic substrate and has through-holes in which the wiring of the silicon substrate and the wiring from the heat insulation organic substrate are connected;
a heat releasing unit which includes aluminum, is formed so as to surround an edge of the three-dimensional LED substrate, and is joined to an outside edge of the chip-mounting substrate and an outside edge of the aluminum substrate;
a globe which is formed so as to cover an LED-mounting side of the three-dimensional LED substrate at an opening of the heat releasing unit; and
a metal cap which is connected to the heat releasing unit.

5. The LED lighting device according to claim 4,
wherein the chip mounting substrate is a silicon substrate and the three-dimensional LED substrate has a sensor chip which is connected to the wiring of the chip-mounting silicon substrate via micro bumps, and mounted, via such micro bumps, on a side of the chip-mounting silicon substrate opposite the heat insulation organic substrate.

6. An LED lighting device comprising:
at least one LED element;
a silicon substrate on which the LED element is mounted;
a heat releasing unit with thermal conductivity which is joined to an edge of the silicon substrate and formed so as to surround the silicon substrate;
a heat insulation substrate which is stuck to a side of the silicon substrate opposite the LED element;
a chip-mounting substrate which is stuck to a side of the heat insulation substrate opposite the silicon substrate;
at least one circuit chip which is mounted on a side of the chip-mounting substrate opposite side the heat insulation substrate; and
a power input terminal which is electrically connected to the LED element and from which electric power is input.

7. The LED lighting device according to claim 6,
wherein the chip-mounting substrate is a silicon substrate,
wherein the heat releasing unit is joined to an edge of the chip-mounting substrate and is formed so as to surround the chip-mounting substrate.

8. The LED lighting device according to claim 7,
wherein the circuit chip is at least chip taken from the group consisting of an LED control circuit chip, an application chip, and a sensor chip.

9. The LED lighting device according to claim 6,
wherein the circuit chip is at least one chip taken from the group consisting of an LED control circuit chip, an application chip, and a sensor chip.

10. An LED lighting device comprising:
at least one LED element;
a silicon substrate on which the LED element is mounted;
a heat insulation substrate which is stuck to a side of the silicon substrate opposite the LED element;
a chip-mounting substrate which has a substrate including silicon and is stuck to a side of the heat insulation substrate opposite the silicon substrate,
at least one circuit chip which is mounted on a side of the chip-mounting substrate opposite the heat insulation substrate,
a heat conductive panel which is disposed between the silicon substrate and the heat insulation substrate,
a heat releasing unit with thermal conductivity which is joined to each edge of the chip-mounting substrate and the heat conductive panel and formed so as to surround each of the silicon substrate, the chip-mounting substrate, and the heat conductive panel; and
a power input terminal which is electrically connected to the LED element and from which electric power is input.

11. The LED lighting device according to claim 10,
wherein the circuit chip is at least chip taken from the group consisting of an LED control circuit chip, an application chip, and a sensor chip.

\* \* \* \* \*